United States Patent
Singleton et al.

(10) Patent No.: US 10,760,270 B2
(45) Date of Patent: *Sep. 1, 2020

(54) STRUCTURAL INSULATED PANEL FRAMING SYSTEM

(71) Applicant: Nexgen Framing Solutions LLC, Jupiter, FL (US)

(72) Inventors: Clifton D. Singleton, Melbourne, FL (US); Zonnie C. Singleton, Melbourne Beach, FL (US)

(73) Assignee: Nexgen Framing Solutions LLC, Jupiter, FL (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/488,477

(22) Filed: Apr. 15, 2017

(65) Prior Publication Data
US 2017/0234008 A1   Aug. 17, 2017

Related U.S. Application Data

(62) Division of application No. 13/897,145, filed on May 17, 2013, now Pat. No. 9,624,666.

(60) Provisional application No. 61/648,980, filed on May 18, 2012.

(51) Int. Cl.
| | |
|---|---|
| *E04C 2/284* | (2006.01) |
| *E04C 2/52* | (2006.01) |
| *E04B 2/00* | (2006.01) |
| *E04B 1/76* | (2006.01) |
| *E04B 2/58* | (2006.01) |
| *E04C 2/38* | (2006.01) |
| *E04C 2/34* | (2006.01) |

(52) U.S. Cl.
CPC ............ *E04C 2/284* (2013.01); *E04B 1/7604* (2013.01); *E04B 1/7654* (2013.01); *E04B 2/58* (2013.01); *E04C 2/384* (2013.01); *E04C 2/46* (2013.01); *E04C 2/521* (2013.01); *E04C 2002/3488* (2013.01)

(58) Field of Classification Search
CPC .......... E04C 2/284; E04C 2/384; E04C 2/521; E04C 2/46; E04C 2002/3488
USPC ........... 52/309.7, 309.8, 309.9, 404.1, 742.1, 52/220.1
See application file for complete search history.

(56) References Cited

U.S. PATENT DOCUMENTS

| | | | | |
|---|---|---|---|---|
| 1,448,886 A | * | 3/1923 | Walper | ...................... E04B 2/56 52/105 |
| 1,458,770 A | * | 6/1923 | Marks | ....................... E04B 7/00 52/338 |
| 1,592,807 A | * | 7/1926 | Forrest | .................... E04B 2/845 52/344 |

(Continued)

OTHER PUBLICATIONS

International Search Report and Written Opinion dated Oct. 4, 2013 in corresponding Int'l. Application No. PCT/US2013/041672 filed May 17, 2013 (7 pages).

*Primary Examiner* — Patrick J Maestri
*Assistant Examiner* — Joseph J. Sadlon
(74) *Attorney, Agent, or Firm* — Dentons US LLP

(57) ABSTRACT

Systems and methods are disclosed herein to a structural insulated panel framing system comprising: insulation sheathing receivable by a wall jig; a frame for placement atop the insulation sheathing; and spray foam for application to the frame and the insulation sheathing to fuse the frame and insulation sheathing to produce a structural insulated panel.

41 Claims, 11 Drawing Sheets

(56) References Cited

U.S. PATENT DOCUMENTS

| | | | | |
|---|---|---|---|---|
| 2,186,461 A * | 1/1940 | Thompson | E04B 2/62 | 52/259 |
| 2,200,650 A * | 5/1940 | Welch | B32B 27/00 | 156/245 |
| 3,044,583 A | 7/1962 | Robert et al. | | |
| 3,159,882 A * | 12/1964 | Slayter | E04B 1/76 | 52/411 |
| 3,562,985 A * | 2/1971 | Nicosia | E04B 2/7403 | 428/188 |
| 3,605,365 A * | 9/1971 | Hastings | E04B 1/35 | 52/309.11 |
| 3,785,913 A * | 1/1974 | Hallamore | E04C 2/284 | 156/71 |
| 4,044,511 A | 8/1977 | Lingle | | |
| 4,045,922 A * | 9/1977 | Elliott | B60P 3/32 | 52/94 |
| 4,134,242 A | 1/1979 | Musz et al. | | |
| 4,161,852 A * | 7/1979 | Schultz | E04B 1/0007 | 52/250 |
| 4,185,437 A * | 1/1980 | Robinson | E04C 2/384 | 264/256 |
| 4,260,569 A * | 4/1981 | Hurst | B29C 44/1228 | 264/45.4 |
| 4,292,775 A * | 10/1981 | Howard | E04B 1/7654 | 52/220.1 |
| 4,344,265 A | 8/1982 | Davidson | | |
| 4,372,089 A | 2/1983 | Akesson | | |
| 4,422,274 A * | 12/1983 | Holliday | B01J 19/0053 | 52/410 |
| 4,476,658 A * | 10/1984 | Johnstone | E04D 3/366 | 52/395 |
| 4,517,782 A * | 5/1985 | Shamszadeh | E04B 5/40 | 428/319.1 |
| 4,557,092 A * | 12/1985 | Brueske | E04B 7/00 | 52/404.1 |
| 4,558,552 A * | 12/1985 | Reitter, II | E04B 2/56 | 156/91 |
| 4,562,674 A | 1/1986 | Nelson | | |
| 4,635,423 A | 1/1987 | Ward | | |
| 4,703,604 A * | 11/1987 | Muller | E04B 1/35 | 52/235 |
| 4,735,026 A | 4/1988 | Forsythe | | |
| 4,785,602 A * | 11/1988 | Giurlani | B21F 27/128 | 52/309.12 |
| 4,825,089 A * | 4/1989 | Lindsay | E04B 1/7654 | 250/515.1 |
| 4,841,710 A | 6/1989 | Considine | | |
| 4,970,838 A * | 11/1990 | Phillips | E04B 1/04 | 52/250 |
| 4,989,688 A * | 2/1991 | Nelson | E04B 1/8227 | 181/286 |
| 5,027,572 A * | 7/1991 | Purcell | E04B 1/66 | 52/309.9 |
| 5,048,254 A * | 9/1991 | Merlau | E04C 2/384 | 52/235 |
| 5,095,674 A * | 3/1992 | Huettemann | E04B 5/04 | 264/34 |
| 5,268,137 A * | 12/1993 | Scott | B28B 19/0061 | 249/112 |
| 5,353,563 A * | 10/1994 | White | E04O 2/24 | 52/309.13 |
| 5,365,716 A * | 11/1994 | Munson | E04B 1/7604 | 52/404.1 |
| 5,486,391 A | 1/1996 | Tyner | | |
| 5,497,589 A | 3/1996 | Porter | | |
| 5,519,971 A | 5/1996 | Ramirez | | |
| 5,577,363 A | 11/1996 | Tate et al. | | |
| 5,596,847 A * | 1/1997 | Stephenson | E04D 13/172 | 52/198 |
| 5,666,780 A | 9/1997 | Romes et al. | | |
| 5,678,369 A * | 10/1997 | Ishikawa | B32B 3/02 | 52/309.7 |
| 5,724,783 A | 3/1998 | Mandish | | |
| 5,729,936 A * | 3/1998 | Maxwell | E04C 2/16 | 52/220.2 |
| 5,758,463 A | 6/1998 | Mancini, Jr. | | |
| 5,765,330 A | 6/1998 | Richard | | |
| 5,799,462 A | 9/1998 | McKinney | | |
| 5,842,276 A * | 12/1998 | Asher | B26D 1/553 | 264/142 |
| 5,953,883 A | 9/1999 | Ojala | | |
| 6,041,562 A | 3/2000 | Martella et al. | | |
| 6,105,335 A * | 8/2000 | Vohra | E04B 1/7604 | 52/293.1 |
| 6,112,473 A | 9/2000 | Pingel | | |
| 6,119,422 A * | 9/2000 | Clear | E04F 13/0875 | 52/268 |
| 6,125,608 A | 10/2000 | Charlson | | |
| 6,177,180 B1 | 1/2001 | Bodine et al. | | |
| 6,240,701 B1 * | 6/2001 | Moses | B28B 1/008 | 264/255 |
| 6,308,491 B1 | 10/2001 | Porter | | |
| 6,383,610 B1 | 5/2002 | Barz et al. | | |
| 6,395,401 B1 * | 5/2002 | Bramlett | B32B 7/12 | 428/489 |
| 6,526,714 B1 * | 3/2003 | Billings | B28B 1/16 | 52/268 |
| 6,591,567 B2 * | 7/2003 | Hota | B29O 65/342 | 14/13 |
| 6,599,621 B2 | 7/2003 | Porter | | |
| 6,698,157 B1 | 3/2004 | Porter | | |
| 6,743,326 B2 * | 6/2004 | Bogrett | E04B 1/767 | 156/268 |
| 6,857,237 B1 * | 2/2005 | Dalphond | E04C 2/384 | 52/284 |
| 7,073,306 B1 * | 7/2006 | Hagaman | E04B 1/35 | 249/20 |
| 7,127,856 B2 | 10/2006 | Hagen, Jr. et al. | | |
| 7,168,216 B2 | 1/2007 | Hagen, Jr. | | |
| 7,249,653 B2 * | 7/2007 | Sheng | E04B 1/86 | 181/207 |
| 7,543,419 B2 * | 6/2009 | Rue | E04C 2/22 | 52/309.16 |
| 7,574,837 B2 | 8/2009 | Hagen, Jr. et al. | | |
| 7,614,820 B2 * | 11/2009 | Shaw | E04F 15/12 | 404/20 |
| 7,625,827 B2 * | 12/2009 | Egan | D03D 1/00 | 442/20 |
| 7,726,079 B2 * | 6/2010 | Raineri | E04B 1/7069 | 52/209 |
| 7,757,448 B2 * | 7/2010 | Zhu | E04B 1/161 | 52/309.11 |
| 7,870,698 B2 * | 1/2011 | Tonyan | B28B 5/027 | 106/735 |
| 7,895,796 B2 * | 3/2011 | Baldock | E04B 1/08 | 52/167.1 |
| 7,921,617 B2 * | 4/2011 | Stevens | E04B 5/02 | 52/356 |
| 8,365,497 B2 * | 2/2013 | Rothwell | E04C 2/386 | 156/71 |
| 8,495,852 B2 | 7/2013 | Fay | | |
| 8,621,817 B1 * | 1/2014 | Kreizinger | E04B 1/762 | 264/71 |
| 8,635,828 B2 * | 1/2014 | Bahnmiller | B32B 5/14 | 52/489.1 |
| 8,677,719 B2 * | 3/2014 | Farrell, Jr. | E04O 2/044 | 52/371 |
| 8,726,598 B2 | 5/2014 | Harding | | |
| 8,789,329 B2 * | 7/2014 | Radoane | E04B 2/58 | 52/309.5 |
| 8,806,825 B2 * | 8/2014 | Egan | E04B 1/762 | 428/317.5 |
| 8,820,016 B2 * | 9/2014 | Zhou | E04B 1/762 | 52/404.2 |
| 8,820,034 B1 | 9/2014 | Watts et al. | | |
| 8,839,580 B2 * | 9/2014 | Long, Sr. | E04C 2/044 | 52/223.6 |
| 8,857,116 B2 | 10/2014 | Henriquez | | |

(56) References Cited

U.S. PATENT DOCUMENTS

| | | | |
|---|---|---|---|
| 9,040,143 B2* | 5/2015 | Groft | B32B 3/266 |
| | | | 428/137 |
| 9,145,688 B2* | 9/2015 | Hunt-Hansen | E04F 13/04 |
| 9,162,381 B2* | 10/2015 | Arnauts | B29C 44/1228 |
| 9,315,988 B2* | 4/2016 | Barr | E04B 2/92 |
| 9,499,974 B2* | 11/2016 | Bombino | E04B 1/7612 |
| 9,702,152 B2* | 7/2017 | Sievers | E04C 2/386 |
| 9,708,781 B2* | 7/2017 | Sanders | E01F 8/0023 |
| 2004/0067352 A1 | 4/2004 | Hagerman | |
| 2005/0055973 A1 | 3/2005 | Hagen, Jr. et al. | |
| 2006/0117689 A1 | 6/2006 | Onken et al. | |
| 2006/0230706 A1* | 10/2006 | Skendzic | E04B 1/04 |
| | | | 52/794.1 |
| 2006/0270747 A1 | 11/2006 | Griggs | |
| 2008/0083180 A1 | 4/2008 | Miller | |
| 2008/0148663 A1 | 6/2008 | Peede et al. | |
| 2009/0007519 A1 | 1/2009 | Keshishian et al. | |
| 2009/0100780 A1 | 4/2009 | Mathis et al. | |
| 2009/0126299 A1 | 5/2009 | Rozhkov | |
| 2010/0088970 A1 | 4/2010 | Miller | |
| 2011/0047908 A1 | 3/2011 | Brusman et al. | |
| 2011/0054652 A1 | 3/2011 | Heil | |
| 2011/0078971 A1 | 4/2011 | Adams | |
| 2011/0173925 A1 | 7/2011 | Brown | |
| 2011/0268916 A1 | 11/2011 | Pardue, Jr. | |
| 2011/0290104 A1 | 12/2011 | Warren | |
| 2012/0036803 A1* | 2/2012 | Shapiro | E04B 1/7637 |
| | | | 52/302.1 |

* cited by examiner

STRUCTURAL INSULATED PANEL FRAMING SYSTEM

CROSS REFERENCE TO RELATED APPLICATIONS

The present application is a Divisional of U.S. Nonprovisional application Ser. No. 13/897,145 filed 17 May 2013, now U.S. Pat. No. 9,624,666 issued 18 Apr. 2017; which claims the benefit of U.S. Provisional Application Ser. No. 61/648,980 filed 18 May 2012; each of which is incorporated herein by reference in its entirety.

TECHNICAL FIELD

The present disclosure relates generally to structural panels, and more particularly, to a structural panel framing system without mechanical fastening.

BACKGROUND

Conventional construction of a building is generally performed according to well-known processes. Near the beginning of the construction project, excavation equipment prepares a foundation at a job site. Once the foundation is laid, building materials are brought to the job site, such as wood, metal, cement, and other various building materials. Once the raw materials arrive at the job site, construction workers begin the process of erecting a frame at the job site. For example, when a house is constructed, construction workers generally erect wooden framing for the house. After the frame is completed, construction workers fasten sheathing, such as plywood, that covers the outside of the frame using mechanical fasteners, such as nails or screws. After the sheathing has been fastened to the frame, the frames are raised into place to become walls. The walls later receive electrical and plumbing appliances, insulation, and drywall.

The conventional construction method of building walls and wall panels requires a great deal of construction work on the job site. The construction workers must assemble a wall frame, attach sheathing, alter the frame to accommodate electrical and plumbing appliances, and many other steps all at the job site. If the weather is rainy or snowy, construction workers may be unable to build the walls and framing during that time, thereby losing construction time. So, a method of preparing wall panels before construction begins at the job site accelerates the time to construct a building at the job site.

Some companies prepare structural panels in a factory and transport fully assembled structural panels to the construction site where the fully assembled structural panels are raised to form a wall for the building. Some of these factory prepared structural panels are insulated.

Conventional structural insulated panels require top and bottom panels to be integrated or incorporated into the panel. This structure requires an additional step during field installation. Typically, a bottom track must first be installed, a structural insulated wall panel inserted into the bottom track, installing the top track, and fastening the structural insulated wall panel with stud members. This requires a signification amount of time and manpower, as well as slowing down the building process when using structural insulated panels. So, a structural insulated panel that overcomes the problems discussed above is desired.

SUMMARY

The systems and methods described herein attempt to overcome the drawbacks discussed above by forming a structural insulated panel without mechanical fasteners. The structural insulated panel according to the exemplary embodiments may be formed in a factory. The structural insulated panel according to the exemplary embodiments may include pre-formed members of a frame that results in simple assembly of the frame. Also, the frame is pre-cut with pipe holes in the frame members for pipes to run through the panels and anchor holes for easy installation at the job site.

In one embodiment, a structural insulated panel framing system comprises: insulation sheathing receivable by a wall jig; a frame for placement atop the insulation sheathing; and spray foam for application to the frame and the insulation sheathing to fuse the frame and insulation sheathing to produce a structural insulated panel.

In another embodiment, a method for constructing a structural insulated panel comprises: fusing a frame and insulation sheathing using spray foam to produce a structural insulated panel, wherein the insulation sheathing is placed atop a wall jig, and wherein the frame is also placed atop the wall jig in alignment with the insulation sheathing.

In another embodiment, a structural insulated panel comprises: exterior insulation sheathing; a frame engaging the exterior insulation sheathing; and spray foam sprayed within cavities of the frame such that the spray foam substantially covers internal surfaces of the cavities and fuses the frame to the exterior insulation sheathing.

Additional features and advantages of an embodiment will be set forth in the description which follows, and in part will be apparent from the description. The objectives and other advantages of the invention will be realized and attained by the structure particularly pointed out in the exemplary embodiments in the written description and claims hereof as well as the appended drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings constitute a part of this specification and illustrate an embodiment of the invention and together with the specification, explain the invention.

DETAILED DESCRIPTION

Reference will now be made in detail to the preferred embodiments, examples of which are illustrated in the accompanying drawings.

The embodiments described above are intended to be exemplary. One skilled in the art recognizes that numerous alternative components and embodiments may be substituted for the particular examples described herein and still fall within the scope of the invention.

Figure 1:
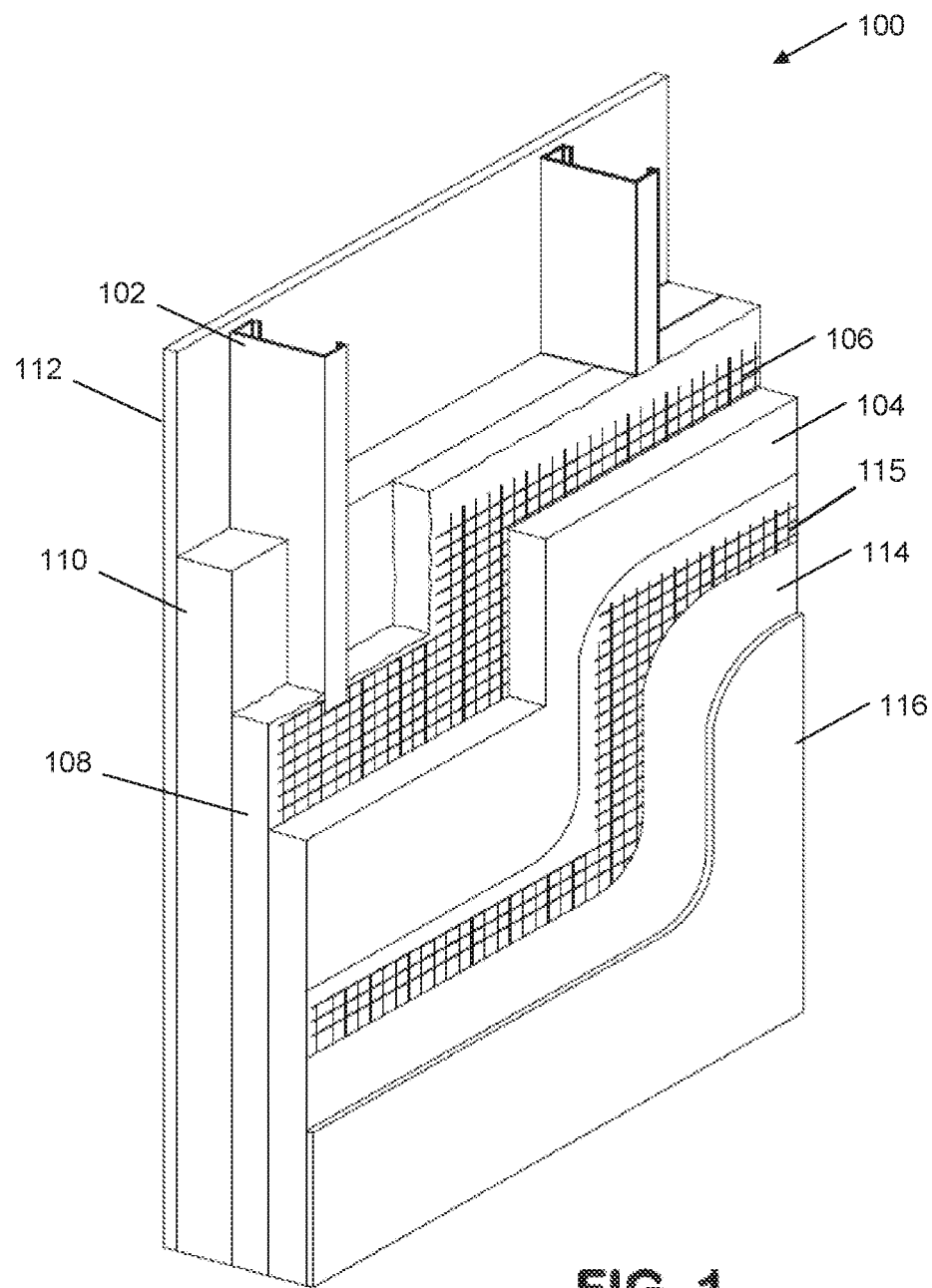
FIG. 1 illustrates material layers comprising a structural insulated panel, according to an exemplary embodiment.

Referring to FIG. 1, FIG. 1 illustrates the material layers comprising the structural insulated panel 100. The structural insulated panel 100 includes a structural framework 102, an exterior insulation sheathing 104, an armor mesh 106, and closed cell spray foam 108.

The structural framework 102 may comprise metal studs or any other framing materials, such as wood framing. The structural framework 102 may comprise any automatic framing system, but preferably, the structural framework 102 comprises cold-formed steel framing, such as the Nuconsteel® Nuframe 3.5" wide steel framing. Also, any size steel frame may comprise the structural framework 102. The structural framework 102 may include steel frames of any steel gauge. For example, the structural framework 102 may have 20 gauge studs at 20 inches on center. The gauge and distance between studs may vary depending on design choices. The structural framework 102 may be riveted, screwed, or crimped, depending on the steel stud manufacturers recommendation. The structural framework 102 includes studs, members, braces, blockings, and any other pieces necessary to construct the structural framework 102. The structural framework 102 may be formed and assembled before assembling the structural insulated panel 100, which is described in greater detail below in reference to FIG. 2.

The exterior insulation sheathing 104 may be, but is not limited to, expanded polystyrene (EPS). The exterior insulation sheathing 104 may also comprise extruded polystyrene (XPS) or any other rigid sheathing. For example, if EPS sheathing is used, the EPS sheathing may have a thickness of 1 inch, and a minimum density of 2 pounds per cubic foot. The exterior insulation sheathing 104 may come in a standard size of 4 feet by 16 feet, but the exterior insulation sheathing 104 may be cut according to a specification for the panel. The exterior insulation sheathing 104 may also be cut for openings, such as doors or windows, or irregularities, such as if the panel 100 is not rectangular in shape.

The armor mesh 106 may comprise a woven fiber glass mesh material that is applied to the external insulation sheathing 104 or embedded into the closed cell spray foam 108. Preferably, the woven fiber glass material comprising the armor mesh 106 has a weight of 4.5 ounces per yard, but other weights may be used to form the armor mesh 106. The armor mesh 106 may include other thicknesses, weights, or materials so long as the closed cell spray foam 108 is able to circumvent or penetrate the armor mesh 106 and glue together the exterior insulation sheathing 104, the structural framework 102, and the armor mesh 106.

The closed cell spray foam 108 may generally be sprayed onto the other material layers to a thickness of 1 inch. The closed cell spray foam 108 may have any thickness, but the closed cell spray foam 108 may have at least one inch thickness. The closed cell spray foam 108 may have a density of 2 pounds per cubic foot. The closed cell spray foam 108 may have another density, but the closed cell spray foam 108 has a density of at least 1.8 pounds per cubic foot. The density of the closed cell spray foam 108 may be chosen based on a desired impact resistance and r-value for thermal resistance.

In some embodiments, the structural insulated panel 100 further comprises open cell spray foam 110. The open cell spray foam 110 may have a density of 0.5 pounds per cubic foot. The open cell spray foam 110 may have a thickness that depends on the width of the structural framework 102. For example, if the structural framework 102 is 3.5" in depth, the open cell spray foam 110 may have a maximum thickness of 2.5". The density of the open cell spray foam 110 may also be chosen based on a desired impact resistance and r-value.

In some embodiments, the structural insulated panel 100 further comprises a drywall board 112. The drywall board 112 may comprise gypsum and may be coated with any common interior finish, such as paint or wall paper. For example, the drywall board 112 may have a thickness of ½ inch.

In some embodiments, the structural insulated panel 100 may further comprise an exterior insulation finishing system (EIFS) or stucco base coat 114 and finishing coat 116, such as BASF.RTM. Synergy.TM. Alpha basecoat and BASF.RTM. Synergy.TM. finish coat, if the structural insulated panel 100 includes EIFS or stucco. If the structural insulated panel 100 includes the base coat 114, an open weave glass fiber reinforcement mesh 115 may be embedded in the base coat 114. The finish coat 116 may include textured or colored material, or the finish coat 116 may be 100% acrylic.

The base coat 114 and the finishing coat 116 are one example of an exterior surface that may be applied to the structural insulated panel 100, but many other exterior finishes may be applied to the structural insulated panel 100, such as cement siding, metal siding, PVC siding, paint, or any other exterior finish.

Figure 2A:
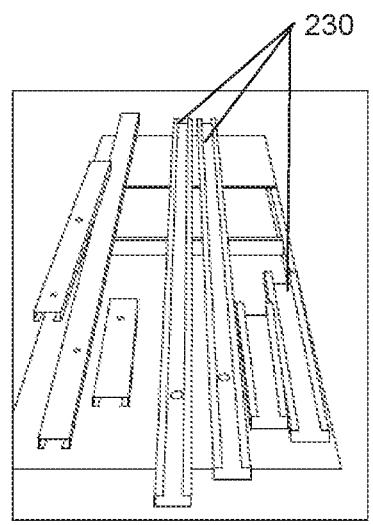
FIGS. 2A-2E illustrate an exemplary structural framework for the structural insulated panel, according to an exemplary embodiment.
Figure 2B:
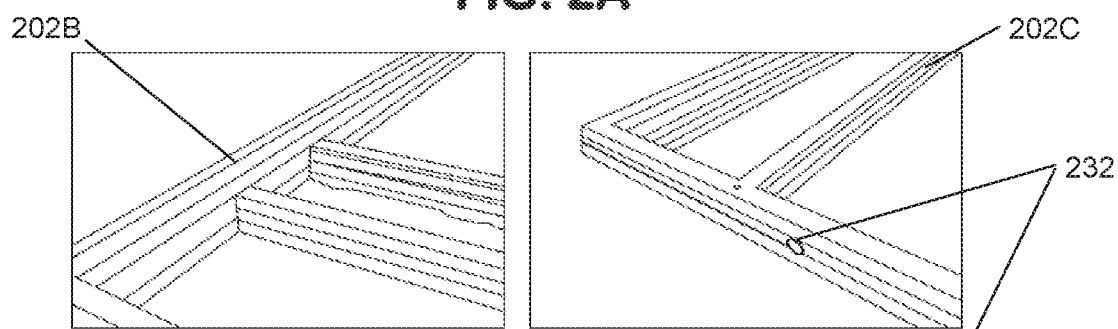
Figure 2C:
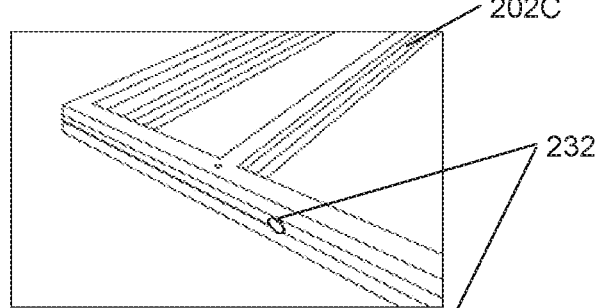

Referring to FIGS. 2A-2E, FIGS. 2A-2E illustrate exemplary structural frameworks 202B-E and structural framework components. As shown in FIG. 2A, a plurality of framing components 230 may be formed using a roll former. The roll former may include galvanized steel coils that assist in forming the framing components 230. A software application may be used to design the structural framework 202, and the software created design may be printed out using the roll former. The software application allows a designer to not only control the sizes, thickness, gauge, and distance between studs, but the software application also allows a designer to design for abnormalities into the structural framework 202, such as holes 232 where electrical wiring, may extend through the structural insulated panel.

Figure 2D:
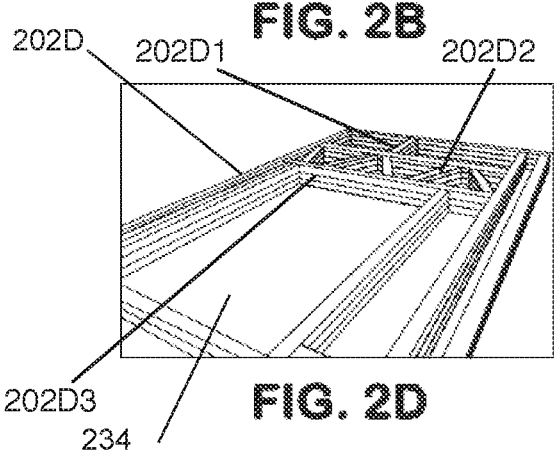
Figure 2E:
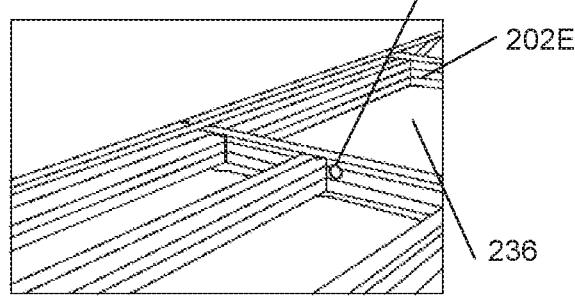

The roll former may create studs, blocks, beams, posts, bracings, strappings, or any other type of framing component 230 for inclusion in the structural frameworks 202B-E. The framing components 230 are cut, punched, notched and pre-drilled to receive rivets or screws for assembly. When all the framing components 230 have been formed, the framing components 230 are assembled with a pop-riveter or an electric screw gun based on the type of fasteners chosen to assemble the structural framework 202. The structural frameworks 202 may be fabricated to any length or height. FIGS. 2B-2E show a plurality of different structural frameworks 202B-E. As shown in FIGS. 2B-2E, the shape and structure of the structural frameworks 202B-E may vary according to design specifications. For example, the structural framework 202D in FIG. 2D is cut for a window 234, and the structural framework 202E in FIG. 2E is cut for a doorway 236. When forming the frame components 230, each frame component 230 may be pre-labeled with an alpha-numeric label. The labels on the frame components 230 may match labels from the software application, and the labels may assist in assembling the structural framework 202.

Figure 3A:
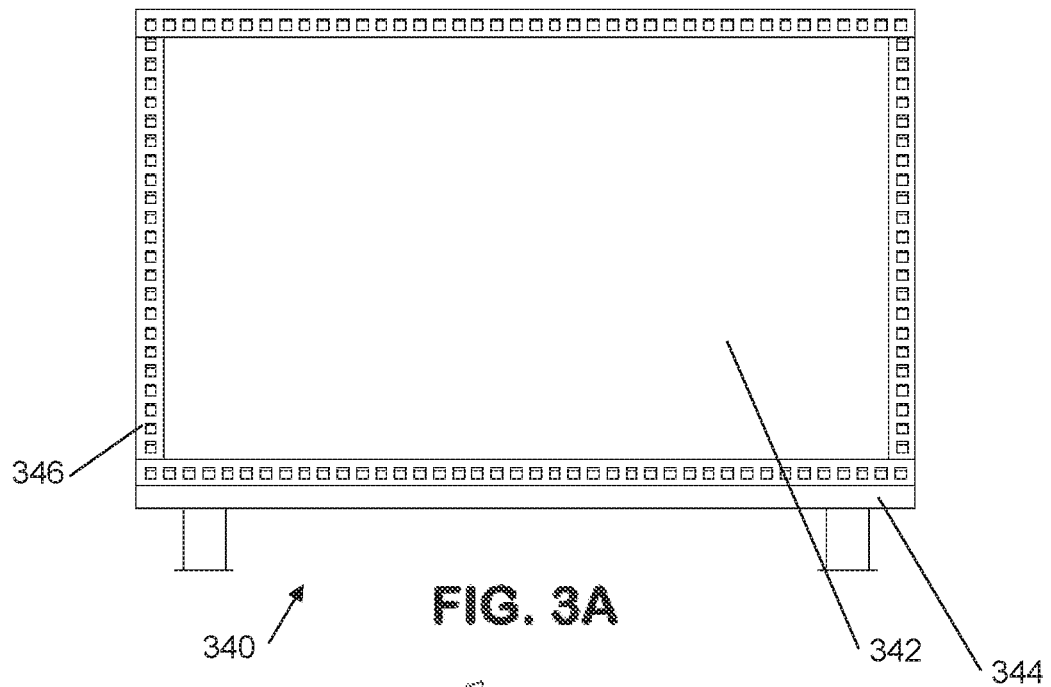
FIGS. 3A and 3B illustrate a wall jig used to assemble the structural insulated panel, according to an exemplary embodiment.
Figure 3B:
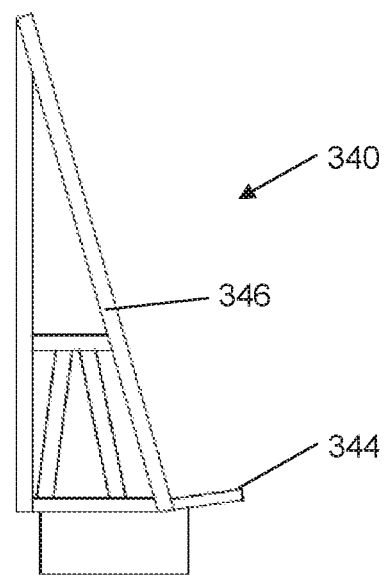

FIGS. 3A and 3B illustrate an exemplary wall jig 340 that may be used to assist in assembling the structural insulated panel. FIG. 3A illustrates a front view of the wall jig 340, and FIG. 3B illustrates a side view of the wall jig 340. As shown in FIGS. 3A and 3B, the wall jig 340 includes a flat back panel 342 and a ledge 344. Components of the structural insulated panel may be placed on the ledge 344 and laid against the flat back panel 342. The flat back panel 342 may be angled so that components of the structural insulated panel may be leaned against the flat back panel 342 during panel assembly. The flat back panel 342 and the ledge 344 may each extend substantially perpendicularly to each other. The wall jig 340 may be relatively tall, such as over 18 feet tall so that the wall jig 340 is taller than any structural insulated panel being assembled using the wall jig 340. The flat back panel 342 may be surrounded by a metal locking bar 346. The metal locking bar 346 may receive tie bars, and the tie bars secure the panel components against the wall jig 340, which is described in greater detail with reference to FIGS. 6A-6B. The wall jig 340 may further include a clamping mechanism used to secure horizontal tie bars to the ledge 344.

Figure 4A:
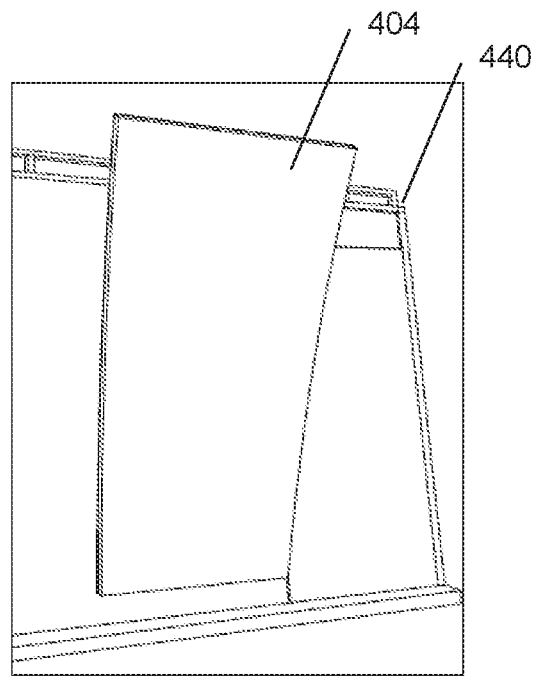
FIGS. 4A and 4B illustrate exterior insulation sheathing being placed on a wall jig, according to an exemplary embodiment.
Figure 4B:
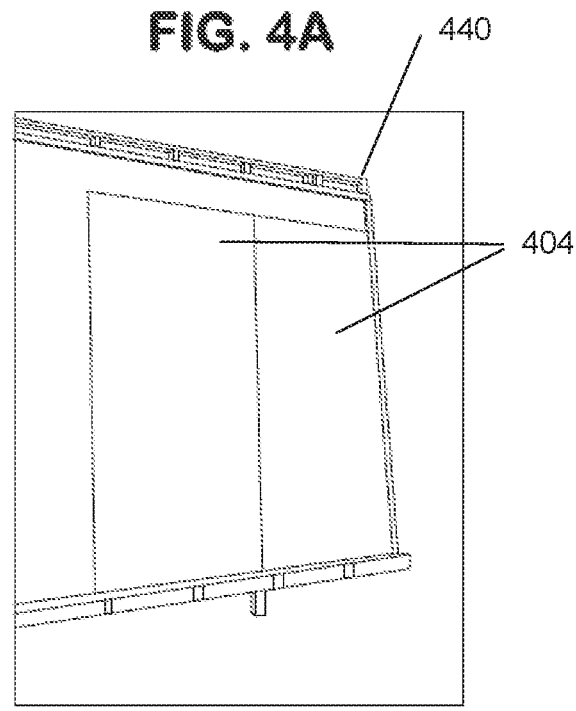

FIGS. 4A-B illustrates two sections of the exterior insulation sheathing 404 being laid against the wall jig 440. As shown in FIG. 4A, a section of exterior insulation sheathing 404 is being laid against the wall jig 440, and in FIG. 4B, two sections of exterior insulation sheathing 404 rest against the wall jig 440.

Figure 5A:
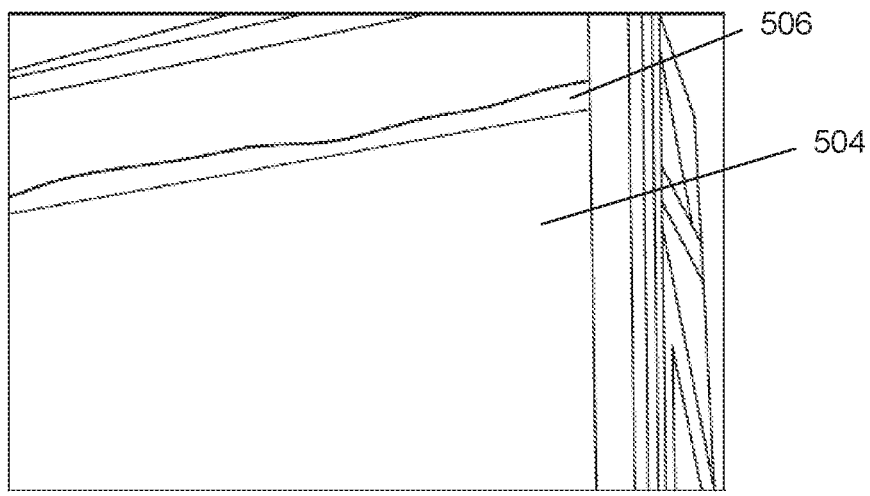
FIGS. 5A and 5B illustrate a woven fiberglass mesh being applied to the exterior insulation sheathing, according to an exemplary embodiment.
Figure 5B:
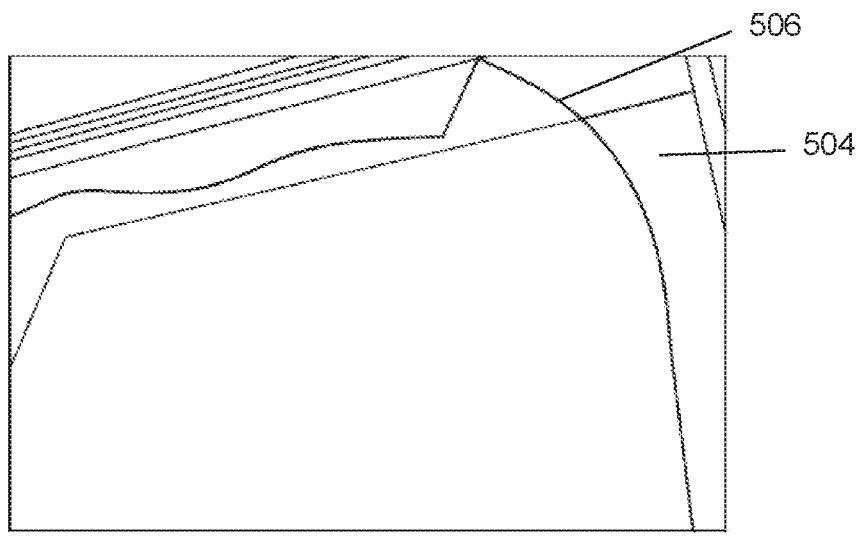

After placing the exterior insulation sheathing 404 on the wall jig 440, the armor mesh is applied to the exterior insulation sheathing 404. Referring to FIGS. 5A and 5B, the armor mesh 506 is attached to the exterior insulation sheathing 504. The armor mesh 506 may be temporarily attached to the exterior insulation sheathing 504 using mechanical fasteners, such as nail tacks, glue, spray foam, or another adhesive. In some embodiments, the armor mesh 506 comes as a roll, and the roll has a width, such as 48 inches. The armor mesh 406 may be cut and applied to the exterior insulation sheathing 504. When applying the armor mesh 506, the armor mesh 506 should overlap at least 3 inches at joints between two strips of armor mesh 506. The armor mesh 506 reinforces the strength of the exterior insulation sheathing 504. For example, in areas where hurricane force winds occur regularly, the reinforcement provided by the armor mesh 506 helps the structural insulated panel withstand such high winds and strong forces.

After placing the exterior insulation sheathing 504 on the wall jig and placing the armor mesh 506 on the exterior insulation sheathing 504, the exterior insulation sheathing 504 and the armor mesh 506 may be cut to match the design specifications. For example, the exterior insulation sheathing 504 and the armor mesh 506 may be cut for doors and windows. As a result of cutting the exterior insulation sheathing 504 and the armor mesh 506, the exterior insulation sheathing 504 and armor mesh 506 should match the structure of the assembled structural framing.

Figure 6A:
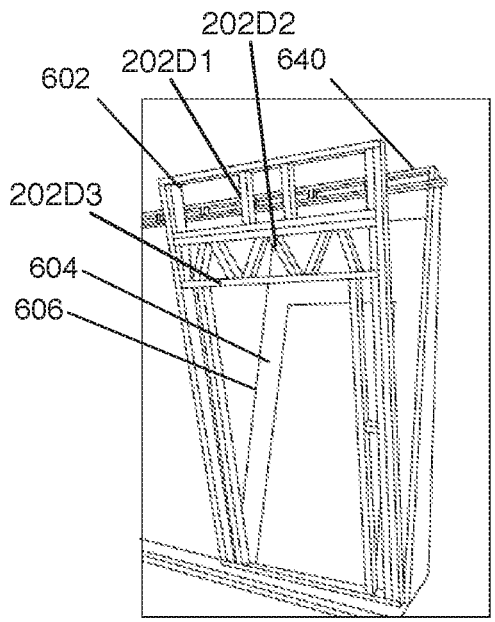
FIGS. 6A-6D illustrate framing being positioned on the wall jig and fastened to the wall jig, according to an exemplary embodiment.

Referring now to FIGS. 6A-6D, after the exterior insulation sheathing 604 and the armor mesh 606 have been cut according to the design of the panel, the wall jig 640 receives the structural framework 602, as shown in FIG. 6A. As shown in FIG. 6A, the cut exterior insulation sheathing 604 matches the assembled structural framework 602 in form, and the structural framework 602 is placed on the wall jig 640 such that the form of the structural framework 602 and the cut exterior insulation sheathing 604 align.

Figure 6B:
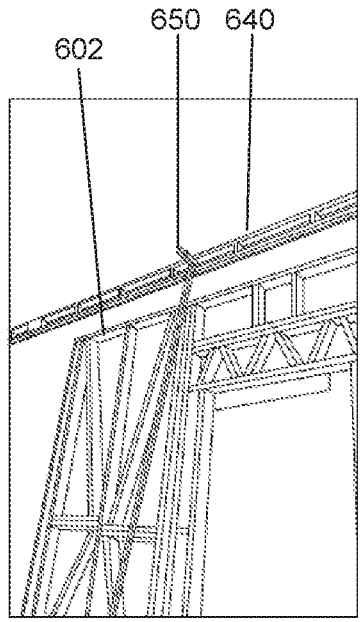
Figure 6C:
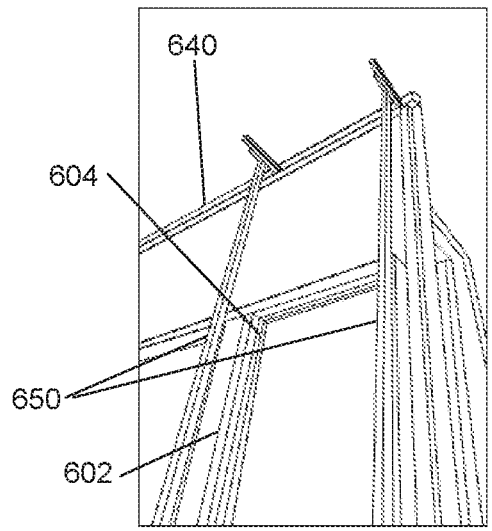

Subsequently, the structural framework 602 and the exterior insulation sheathing 604 are not attached with the use of mechanical fastenings, such as nails or screws. Instead, as shown in FIG. 6B, vertical tie bars 650 are clamped into the wall jig 640 to secure the structural framework 602 to the exterior insulation sheathing 604 and prevent any movement of the structural framework 602 or the exterior insulation sheathing 604 on the wall jig 640. FIG. 6C illustrates two vertical tie bars 650 securely fixing the structural framework 602 to the wall jig 640.

Figure 6D:
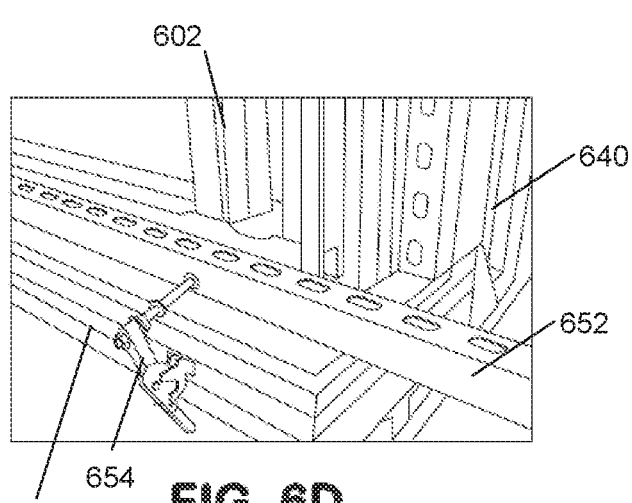

In addition to the vertical tie bars 650, a horizontal spacer bar 652 may be placed on the ledge 644 of the wall jig 640 against the bottom of the structural framework 602, which is illustrated in FIG. 6D. The horizontal spacer bar 652 secures a bottom member of the structural framework 602 to the wall jig 640. A locking mechanism 654 locks the horizontal spacer bar 652 against the structural framework 602.

The horizontal spacer bar 652 and the vertical tie bars 650 securely clamp the structural framework 602 and the exterior insulation sheathing 604, including the adhered armor mesh 606, to the wall jig 640 while a spray foam is applied. The application of the spray foam is described in greater detail with reference to FIGS. 8A and 8B. Once the structural framework 602, the exterior insulation sheathing 604, and the armor mesh 606 are locked into place on the wall jig 640, the spray foam may be applied to fuse together the structural framework 602, the exterior insulation sheathing 604, and the armor mesh 606. After fusing the structural framework 602, the exterior insulation sheathing 604, and the armor mesh 606 using the spray foam, the tie bars 650 and the horizontal space bar 652 are removed and are not included in the structural insulated panel.

Some structural insulated panels include appliances for plumbing or electrical wiring. As described above, the structural framework 602 was designed and cut according to a design that was mindful of such electrical or plumbing appliances. For example, the structural insulated panel may include pipes where plumbing fluid or electrical wires may extend through the panel. FIGS. 7A-7D illustrate such electrical or plumbing appliances installed into a panel.

Figure 7A:
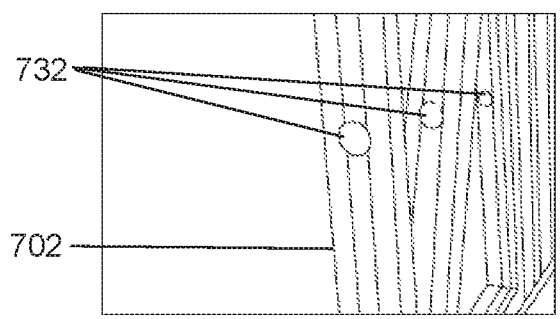
FIGS. 7A-7D illustrate holes and grommets in the structural framework for electrical or plumbing appliances that extend through the structural insulated panel, according to an exemplary embodiment.
Figure 7B:
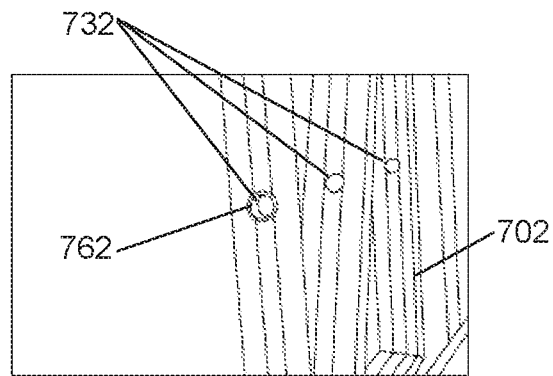
Figure 7C:
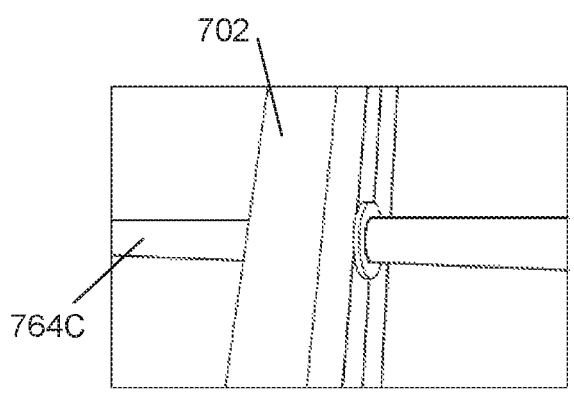
Figure 7D:
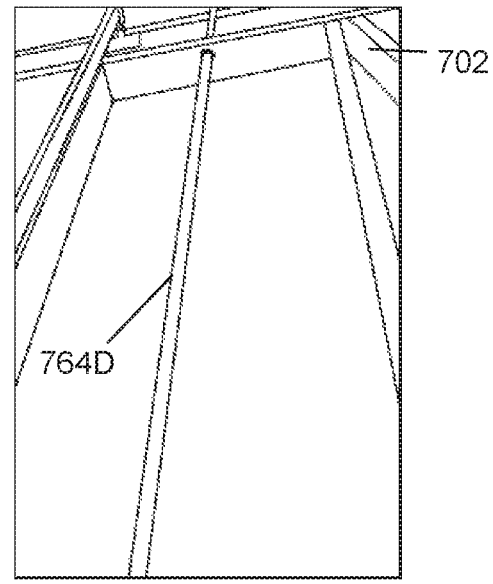

Referring to FIG. 7A, the structural framework 702 has pre-cut holes 732 that accommodate electrical or plumbing appliances. The holes 732 were cut when forming the structural framework 702 components. Referring to FIG. 7B, the holes 732 may be installed with grommets 762, if necessary. A rigid pipe 764C may extend through the holes 732 and grommets 762, as shown in FIG. 7C. For example, electrical wires may extend through the rigid pipe 764C so that an electrician may easily wire a building erected using the structural insulated panels according to the exemplary embodiments described herein. FIG. 7C illustrates a rigid pipe 764C extending horizontally, and FIG. 7D illustrates a rigid pipe 764D extending vertically. The rigid pipe 764C or 764D may extend in any direction so long as the structural framework 702 has been pre-cut in preparation for the installation and extending direction of the rigid pipe 764C or 764D.

The rigid pipe 764C or 764D may be coated with a release agent that prevents spray foam from adhering to the surface of the rigid pipe 764C or 764D. The release agent may be lithium grease, polish wax, vegetable oil, other oils, or any other release agent that prevents the adhesion of spray foam. Other components in the structural insulated panel may need to be coated with the release agent other than the rigid pipe 764C or 764D, depending on the structure of the structural insulated panel. After the application of the spray foam, the rigid pipe 764C or 764D and any other components coated with the release agent my be cleaned of any spray foam clinging to the rigid pipe 764C or 764D before completing assembly of the structural insulated panel.

Figure 8A:
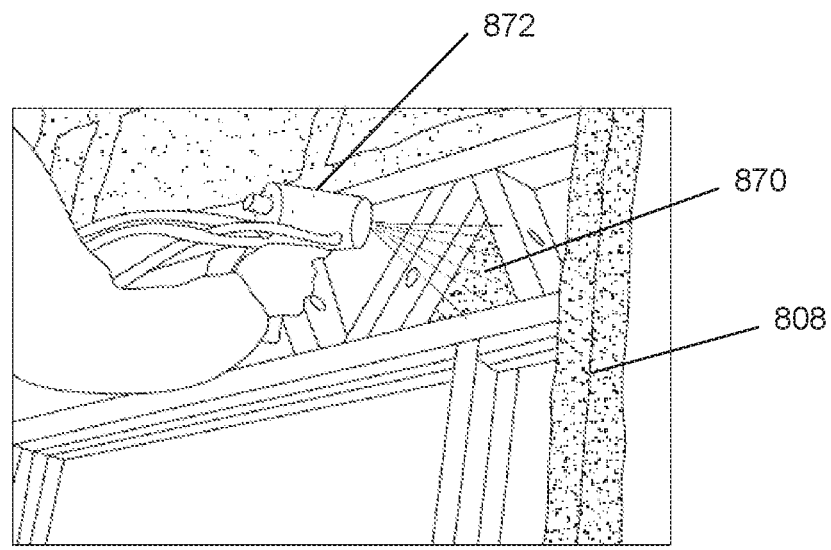
FIGS. 8A and 8B illustrate spray foam being applied to the structural insulated panel, according to an exemplary embodiment.
Figure 8B:
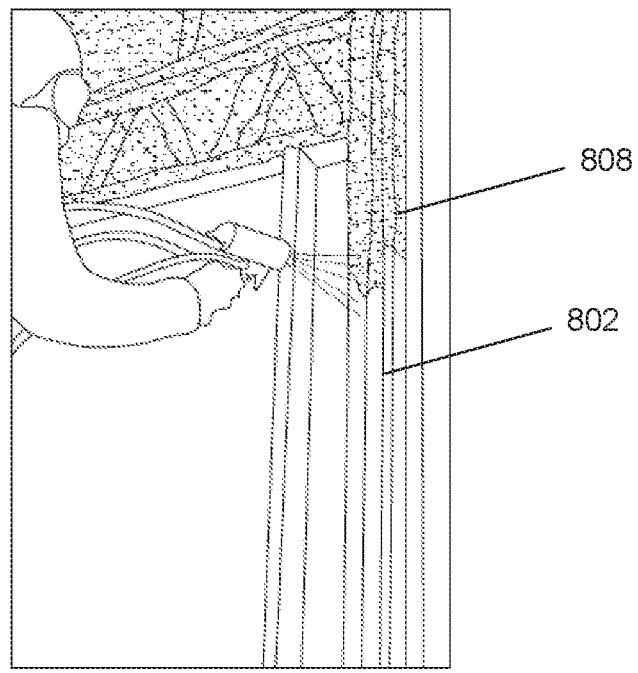

Referring to FIGS. 8A-8B, the closed cell spray foam 808 is applied within stud cavities 870. The spray foam may be sprayed on using a spray foam reactor. The spray foam reactor may heat a two component spray foam comprising icynene and spray polymer to approximately 130 degrees Fahrenheit at 1500 pounds per square inch (psi) of pressure. Other low temperature and low pressure spray foam systems may be substituted for the spray foam reactor described above, such as, for example, TVM® Foam, Tiger Foam™, Froth Pack™ foam.

The spray foam reactor connects to a spray foam gun 872 that is supplied with up to 160 psi of pressurized air, and the spray foam gun applies spray foam 808 within the stud cavities 870 on top of the exterior insulation sheathing 804, the armor mesh 806, and the structural framework 802. As shown in FIG. 8B, the spray foam 808 may substantially cover the studs of the structural framework 802 as well as substantially cover surfaces within the cavities 870. The applied spray foam 808 may substantially coat the exterior insulation sheathing 804, the armor mesh 806, and the structural framework 802 to any thickness, but generally the thickness of the spray foam 808 is approximately 1 inch thick.

By using spray foam to fuse the components of the structural insulation panel rather than mechanical fasteners, the panel may be constructed very quickly. Also, the closed cell spray foam provides thermal insulation properties that help keep the structure cool or warm depending on the season.

The open cell spray foam may fill the remaining cavities 870, but this process of applying the open cell spray foam may occur at the job site after electrical, mechanical, and plumbing systems have been installed in the panel. Open cell spray foam may fill the cavities 870, or other insulation may fill the cavities 870. The open cell spray foam may provide further insulation. So, the insulation of the panel may be provided by either the closed cell spray foam or the open cell spray foam.

Figure 9:
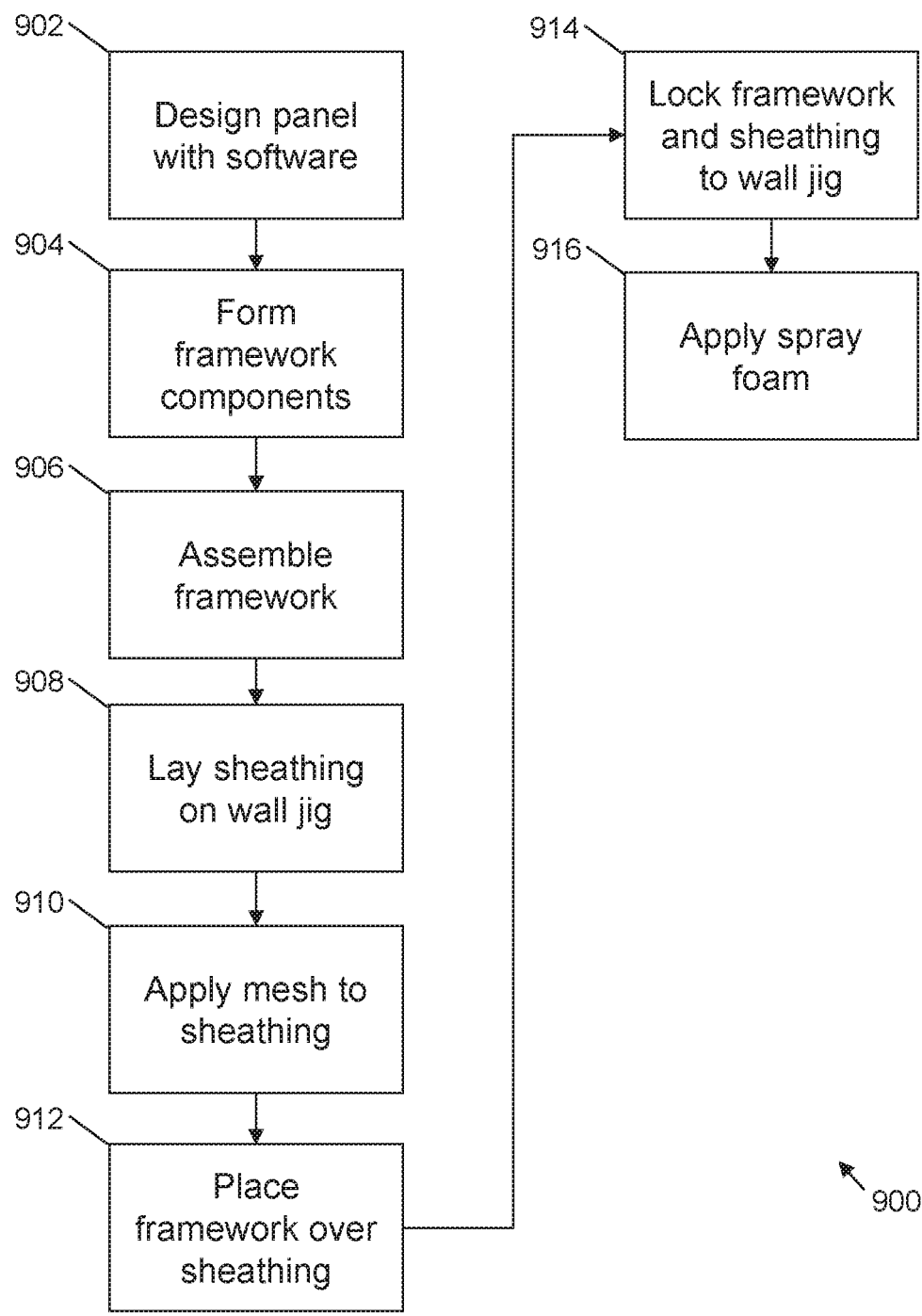
FIG. 9 illustrates a flow chart for assembling the structural insulated panel, according to an exemplary embodiment.

Referring now to FIG. 9, a method 900 for creating a structural insulated panel is illustrated. Beginning in step 902, a software application is used to design the structural insulated panel. The software application allows a user to set the dimensions of the panel; account for any windows, doorways, or other irregularities; and specify the location of any holes for wiring or plumbing appliances. After the software application designs the panel, the software application creates a print map describing how to form all of the members, blocks, and braces that comprise the structural framework. Using the map created by the software application, all structural framework components are formed in step 904 using, for example, a roll former. After forming all the components of the structural framework, the structural framework may be assembled using the formed framework components in step 906. Concurrently, previously, or subsequently to the forming and assembling of the structural framework, the exterior insulation sheathing may be laid on the wall jig in step 908. Subsequently, the armor mesh may be applied to the exterior insulation sheathing in step 910. If necessary, the exterior insulation sheathing and the armor mesh may need to be cut to accommodate doorways or windows or other design features, and this cutting may be performed after the application of the armor mesh. After the exterior insulation sheathing, the armor mesh, and the structural framework are fully formed and prepared, the structural framing may be placed on the wall jig in alignment with the exterior insulation sheathing in step 912. The structural framework may be secured against the exterior insulation sheathing using vertical tie bars, horizontal spacing bars, and locking mechanisms in step 914. After locking and securing the components to the wall jig, rigid pipes may be inserted through pre-cut holes for electrical or plumbing appliances. Finally, in step 916, a spray foam may be applied to the exterior insulation sheathing, the armor mesh, and the structural framework to fuse these components together without the use of mechanical fasteners. The applied spray foam in step 916 may be closed cell or open cell spray foam, or a combination of both. The spray foam may be applied to a thickness of one inch or more depending on a chosen r-value. Optionally, an open cell spray foam may further fill the cavities of the panel, and this optional step may be performed in a factory or at a job site. For example, the closed cell spray foam may be applied to a thickness of 1 inch, and the open cell spray foam may be applied to a thickness of 2.5 inches to fill the cavities of the panel.

During installation at the job site, all panels have structural members built in, so additional bottom and top tracks are not necessary to install the panel at the job site. The bottom track of the structural insulated panel of the exemplary embodiments has pre-punched anchor holes so that no additional drilling is necessary to fasten the wall to the foundation cement slab at the job site. Also, all studs line up with a truss layout designed before constructing the structural insulated panel of the exemplary embodiments. So, a top track is also unnecessary.

Figure 10A:
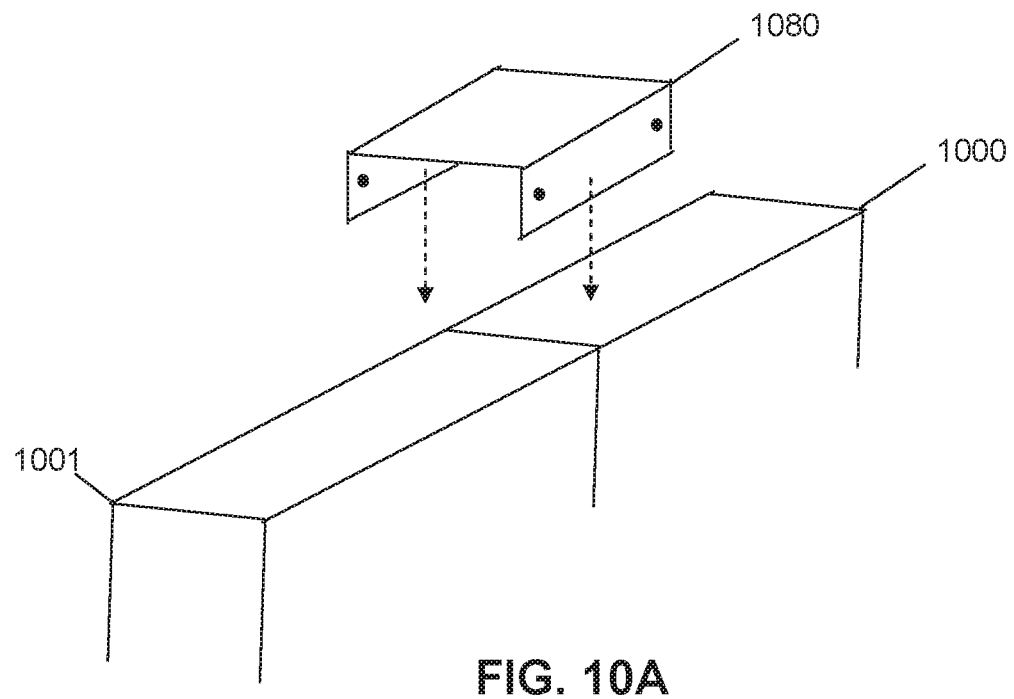
FIGS. 10A-10D illustrate connection plates and splice covers for enabling panel-to-panel connections between structural insulated panels, according to exemplary embodiments.

The structural insulated panel of the exemplary embodiments may further have panel-to-panel connections with top track splice covers and connection plates. As shown in FIG. 10A, a top track splice 1080 may be a C-channel that is at least 8 inches long. The top track splice 1080 bridges over the top track of two adjacent panels 1000, 1001. The top track splice 1080 fastens to both adjacent structural insulated panels 1000, 1001 using at least 4 screws. Exterior screws may be drilled through the exterior insulation sheathing.

Figure 10B:
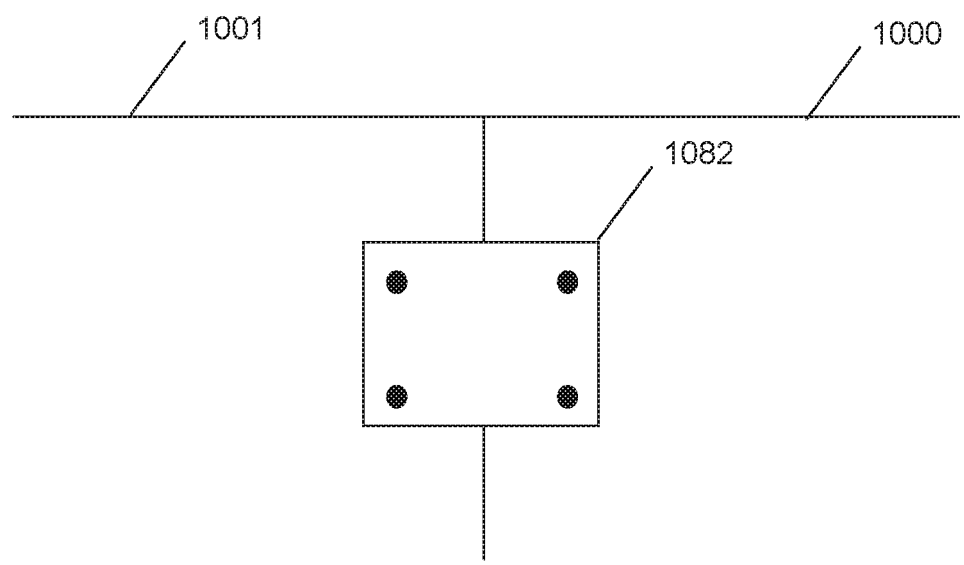

Another panel-to-panel connection is illustrated in FIG. 10B. As shown in FIG. 10B, a connection plate 1082 may further connect adjacent panels 1000, 1001. For example, 3"×3" connection plates 1082 may be spread evenly over the height of the panel, and each connection plate 1082 is screwed into the frame of each panel. For example, the connection plate 1082 has four holes for fasteners, and two fasteners are fastened to each panel 1000, 1001. The connection plates may be placed inside or outside of the building.

Figure 10C:
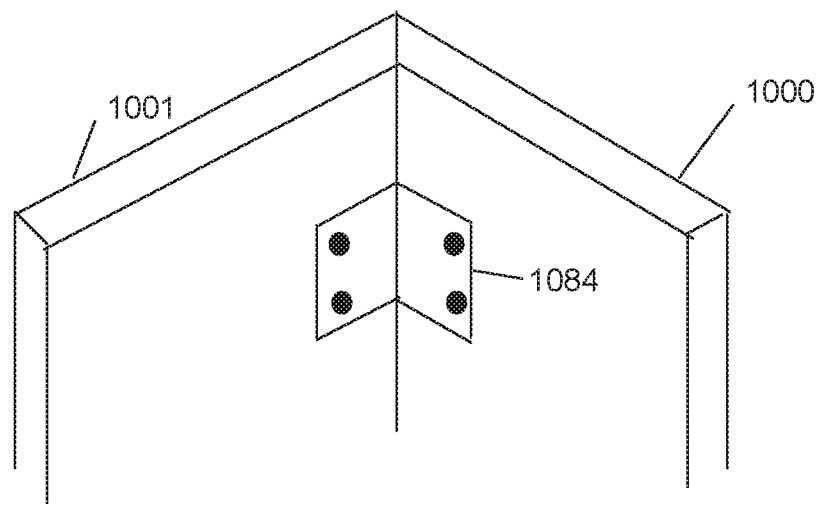

FIG. 10C illustrates an L-shaped connection plate 1084 for a two perpendicular panels 1000, 1001. The L-shaped connection plate 1084 connects two adjacent and perpendicular panels 1000, 1001. Like the connection plate 1082 in FIG. 10B, the L-shaped connection plate 1084 fastens twice to each panel 1000, 1001. The L-shaped connection plate 1084 may be used at corners.

Figure 10D:
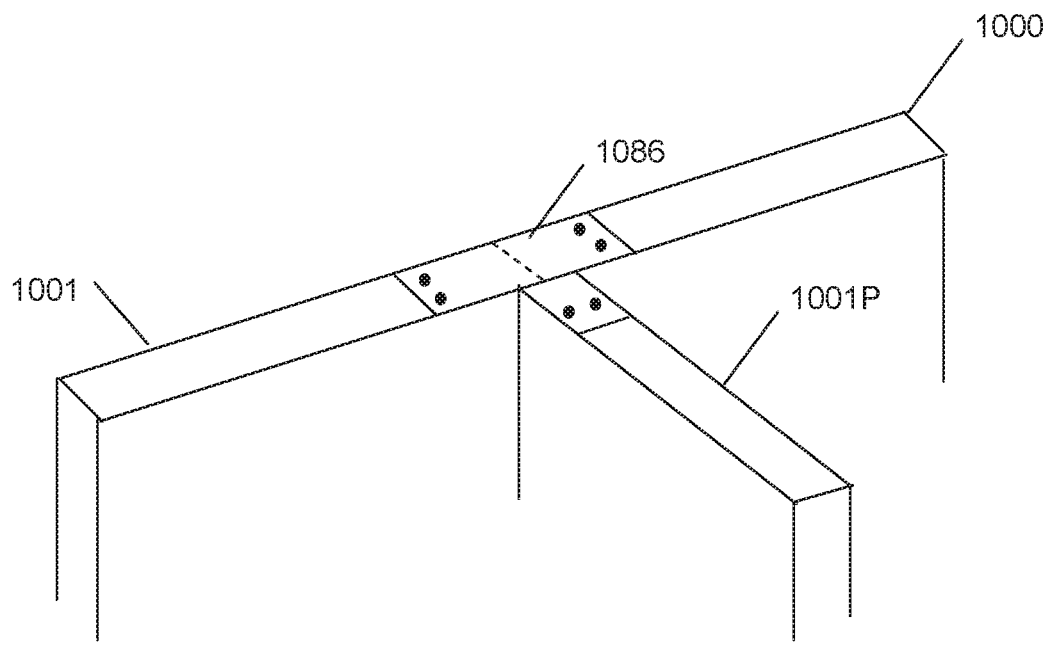

FIG. 10D illustrates a T-shaped connection plate 1086. At the intersection of three panels 1000, 1001, 1001P, the T-shaped connection plate 1086 fastens to each of the three panels 1000, 1001, 1001P. For example, two fasteners may fasten the T-shaped connection plate 1086 to each panel 1000, 1001, 1001P.

While three connection plates have been illustrated in FIGS. 10B-D, other connection plate shapes and configurations may be necessary depending on the architecture of the building.

As described above, the structural insulation panels require simple and fast assembly of wall panels. The wall panel may be brought to the job site as a completed panel, and the pre-cut holes of the top and bottom tracks of the wall allow construction workers to quickly fasten walls to slabs, foundations, floors, ceiling, and other wall panels.

The embodiments described above are intended to be exemplary. One skilled in the art recognizes that numerous alternative components and embodiments that may be substituted for the particular examples described herein and still fall within the scope of the invention.

The invention claimed is:

1. A framing system comprising:
 a structural insulated panel, comprising:
 an insulation sheathing having a proximal side and a distal side;
 a frame comprising a top plate, a bottom plate, a pair of outer studs, and an inner stud, wherein the pair of outer studs and the inner stud span between the top plate and the bottom plate, wherein each of the outer studs and inner stud has a proximal side and a distal side, wherein the inner stud is positioned between the pair of outer studs;
 a mesh, wherein each of the distal sides of the outer studs and the distal side of the inner stud abuts the mesh; and
 at least one of a cured spray foam or an adhesive, wherein the proximal side of the insulation sheathing and the mesh are directly coupled to the frame using one element selected from the group of the cured spray foam, the adhesive, and the cured spray foam and adhesive.

2. The framing system of claim 1, wherein the insulation sheathing is a first insulation sheathing, and wherein the proximal sides of the outer studs and the proximal side of the inner stud are configured to abut a second sheathing.

3. The framing system of claim 1, wherein the frame includes at least one of a framing member, a brace, and a blocking, wherein the at least one of the framing member, the brace, and the blocking is configured to receive at least one of a rivet and a screw.

4. The framing system of claim 1, wherein the insulation sheathing comprises expanded polystyrene.

5. The framing system of claim 1, wherein the mesh is interposed between the proximal side of the insulation sheathing and the frame.

6. The framing system of claim 1, wherein the spray foam comprises a closed cell spray foam.

7. The framing system of claim 1, wherein the mesh is a first mesh, wherein the structural insulated panel further comprises a second mesh, wherein the first mesh contacts the spray foam such that the insulation sheathing, the frame, and the first mesh are unitary, wherein the insulation sheathing is interposed between the first mesh and the second mesh.

8. The framing system of claim 1, further comprising:
 a wall jig;
 a tie bar removably coupled to the wall jig, wherein the wall jig supports the insulation sheathing and the frame, wherein the tie bar secures at least one of the insulation sheathing and the frame to the wall jig.

9. The framing system of claim 1, further comprising:
 a wall jig;
 a spacer bar removably coupled to the wall jig, wherein the wall jig supports the insulation sheathing and the frame, wherein the spacer bar secures the frame to the wall jig.

10. The framing system of claim 9, further comprising:
 a removable locking mechanism coupled to the wall jig, wherein the locking mechanism locks the spacer bar against the frame.

11. The framing system of claim 1, further comprising:
 a wall jig;
 a tie bar removably coupled to the wall jig;
 a spacer bar coupled to the wall jig, wherein the wall jig supports the insulation sheathing and the frame, wherein the tie bar secures at least one of the insulation sheathing and the frame to the wall jig, wherein the spacer bar secures the frame to the wall jig.

12. The framing system of claim 11, further comprising:
 a locking mechanism coupled to the wall jig, wherein the locking mechanism locks the spacer bar against the frame.

13. The structural insulated panel of claim 1, further comprising an appliance extending through the inner stud and the outer studs via a hole through each pair of open ends such that the appliance is positioned between the top plate and the bottom plate.

14. The structural insulated panel of claim 13, wherein the appliance is coated with a release agent that prevents adhesion of spray foam, such that the appliance is removable.

15. The structural insulated panel of claim 1, wherein the inner stud and the outer studs comprise an open shaped structure.

16. The structural insulated panel of claim 15, wherein the inner stud and the outer studs comprise steel.

17. The structural insulated panel of claim 15, wherein the open shaped structure is at least one of a C-shaped or I-shaped structure.

18. The framing system of claim 1, wherein the insulation sheathing and the mesh are coupled to the frame using only adhesive.

19. The framing system of claim 1, wherein the insulation sheathing and the mesh are coupled to the frame using only cured spray foam.

20. A method, comprising:
 positioning an insulation sheathing having a proximal side and a distal side on a wall jig;
 positioning a frame on the wall jig in alignment with the proximal side of the insulation sheathing;
 dispensing at least one of a spray foam or an adhesive within the frame and onto the frame and the proximal side of the insulation sheathing; and
 directly coupling the insulation sheathing to the frame using one element selected from the group of the spray foam, the adhesive, and the spray foam and adhesive.

21. The method of claim 20, further comprising:
 generating a map for forming the frame from frame components using a microprocessor.

22. The method of claim 21, further comprising:
 forming the frame components using a roll former according to the map created using the microprocessor; and
 assembling the frame components to form the frame.

23. The method of claim 20, further comprising:
 applying a mesh to the proximal side of the insulation sheathing before placing the frame on the wall jig, wherein the proximal side of the insulation sheathing faces the frame.

24. The method of claim 23, further comprising:
cutting the insulation sheathing and the mesh so that the insulation sheathing and mesh match the dimensions and configuration of the frame.

25. The method of claim 20, further comprising:
inserting a pipe through pre-cut holes in the frame so that the pipe extends through the structural insulated panel.

26. The method of claim 20, further comprising:
locking the frame and the insulation sheathing to the wall jig using a vertical tie bar that clamps into the wall jig and a locking mechanism that locks a horizontal spacer bar to the wall jig.

27. The method of claim 20, wherein the spray foam is a closed cell spray foam.

28. The method of claim 27, further comprising:
spraying an open cell spray foam within cavities of the structural insulated panel that are not filled by the closed cell spray foam, the insulated sheathing, or the frame.

29. The method of claim 20, wherein the insulation sheathing is coupled to the frame using only adhesive.

30. The method of claim 20, wherein the insulation sheathing is coupled to the frame using only spray foam.

31. A structural insulated panel, comprising:
an insulation sheathing having a proximal side and a distal side;
a frame comprising a top plate, a bottom plate, a pair of outer studs, and an inner stud, wherein the pair of outer studs and the inner stud span between the top plate and the bottom plate, wherein each of the outer studs and inner stud has a proximal side and a distal side, wherein each of the distal sides of the outer studs and the distal side of the inner stud abuts the proximal side of the insulation sheathing, wherein the inner stud is positioned between the pair of outer studs;
a mesh, wherein each of the distal sides of the outer studs and the distal side of the inner stud abuts the mesh; and
at least one of an adhesive dispensed or a spray foam sprayed within cavities of the frame such that the at least one of the adhesive or the spray foam substantially covers internal surfaces of the cavities, and the frame and the mesh are directly coupled to the proximal side of the insulation sheathing using one element selected from the group of the adhesive, the spray foam, and the adhesive and spray foam when the at least one of the adhesive or the spray foam is cured.

32. The structural insulated panel of claim 31, wherein the insulated sheathing comprises an expanded polystyrene.

33. The structural insulated panel of claim 31, wherein the spray foam is a closed cell spray foam.

34. The structural insulated panel of claim 33, wherein a density of the closed cell spray foam is at least 1.8 pounds per cubic foot.

35. The structural insulated panel of claim 33, further comprising:
an open cell spray foam filling the cavities of the frame.

36. The structural insulated panel of claim 35, wherein the open cell spray foam has a density of 0.5 pounds per cubic foot or less.

37. The structural insulated panel of claim 31, wherein the mesh is interposed between and abuts the proximal side of the insulated sheathing and the frame.

38. The structural insulated panel of claim 31, further comprising:
a first mesh abutting the frame and contacting the spray foam such that the spray foam directly couples the first mesh to the frame and the proximal side of the insulation sheathing when cured such that insulation sheathing, the frame, and the first mesh are unitary,
a second mesh coupled to the distal side of the insulation sheathing such that the insulation sheathing is interposed between the first mesh and the second mesh.

39. The structural insulated panel of claim 31, wherein the insulation sheathing is a first insulation sheathing, and wherein the proximal sides of the outer studs and the proximal side of the inner stud are configured to abut a second sheathing.

40. The structural insulated panel of claim 31, wherein the insulation sheathing is coupled to the frame using only adhesive.

41. The structural insulated panel of claim 31, wherein the insulation sheathing is coupled to the frame using only cured spray foam.

* * * * *